(12) United States Patent
Gobbi

(10) Patent No.: US 9,966,925 B2
(45) Date of Patent: May 8, 2018

(54) APPARATUS AND METHOD TO BALANCE THE PARASITIC CAPACITANCES BETWEEN METAL TRACKS ON AN INTEGRATED CIRCUIT CHIP

(71) Applicant: Analog Devices, Inc., Norwood, MA (US)

(72) Inventor: Ronald R. Gobbi, Derry, NH (US)

(73) Assignee: ANALOG DEVICES, INC., Norwood, MA (US)

( * ) Notice: Subject to any disclaimer, the term of this patent is extended or adjusted under 35 U.S.C. 154(b) by 107 days.

(21) Appl. No.: 15/009,334

(22) Filed: Jan. 28, 2016

(65) Prior Publication Data
US 2017/0222615 A1 Aug. 3, 2017

(51) Int. Cl.
| | |
|---|---|
| H05K 1/16 | (2006.01) |
| H03H 7/42 | (2006.01) |
| H01L 23/50 | (2006.01) |
| H01L 23/528 | (2006.01) |
| H01L 23/522 | (2006.01) |
| H03F 1/26 | (2006.01) |
| H03H 3/00 | (2006.01) |
| H03H 7/06 | (2006.01) |

(52) U.S. Cl.
CPC .............. *H03H 7/42* (2013.01); *H01L 23/50* (2013.01); *H01L 23/528* (2013.01); *H01L 23/5222* (2013.01); *H01L 23/5226* (2013.01); *H03F 1/26* (2013.01); *H03H 3/00* (2013.01); *H03F 2200/06* (2013.01)

(58) Field of Classification Search
CPC ........ H03H 3/00; H03H 7/06; H01L 23/5222; H05K 1/16

USPC .......................................... 333/172; 361/766
See application file for complete search history.

(56) References Cited

U.S. PATENT DOCUMENTS

| | | | |
|---|---|---|---|
| 5,264,983 A | 11/1993 | Petrinec | |
| 7,010,629 B1 | 3/2006 | Frame et al. | |
| 7,205,880 B2 | 4/2007 | Fukunaga | |
| 7,277,017 B2 * | 10/2007 | Baba ................... | G06K 19/073 235/492 |
| 7,436,052 B2 | 10/2008 | Gerstenhaber et al. | |
| 8,355,240 B2 | 1/2013 | Satou | |
| 8,742,848 B1 | 6/2014 | Botker | |
| 2015/0022938 A1 | 1/2015 | Okada et al. | |

OTHER PUBLICATIONS

Analog Devices, Inc. "Low Cost Low Power Instrumentation Amplifier" AD620 Rev. G, 2004, in 20 pages.

* cited by examiner

*Primary Examiner* — Dean Takaoka
(74) *Attorney, Agent, or Firm* — Knobbe Martens Olson & Bear LLP

(57) ABSTRACT

Embodiments of the present disclosure provide apparatuses and methods for balancing parasitic capacitances between metal tracks in an integrated circuit chip. Specifically, additional capacitances in the form of, for example, tab capacitors, are attached to the metal tracks with the intention of detaching a select number of the attached capacitances for the purpose of balancing the parasitic capacitances between the metal tracks. The attached capacitances may be structural metal elements. Further, the attached structural metal elements may be detachable at thin-film resistive material associated with each of the attached structural metal elements.

20 Claims, 9 Drawing Sheets

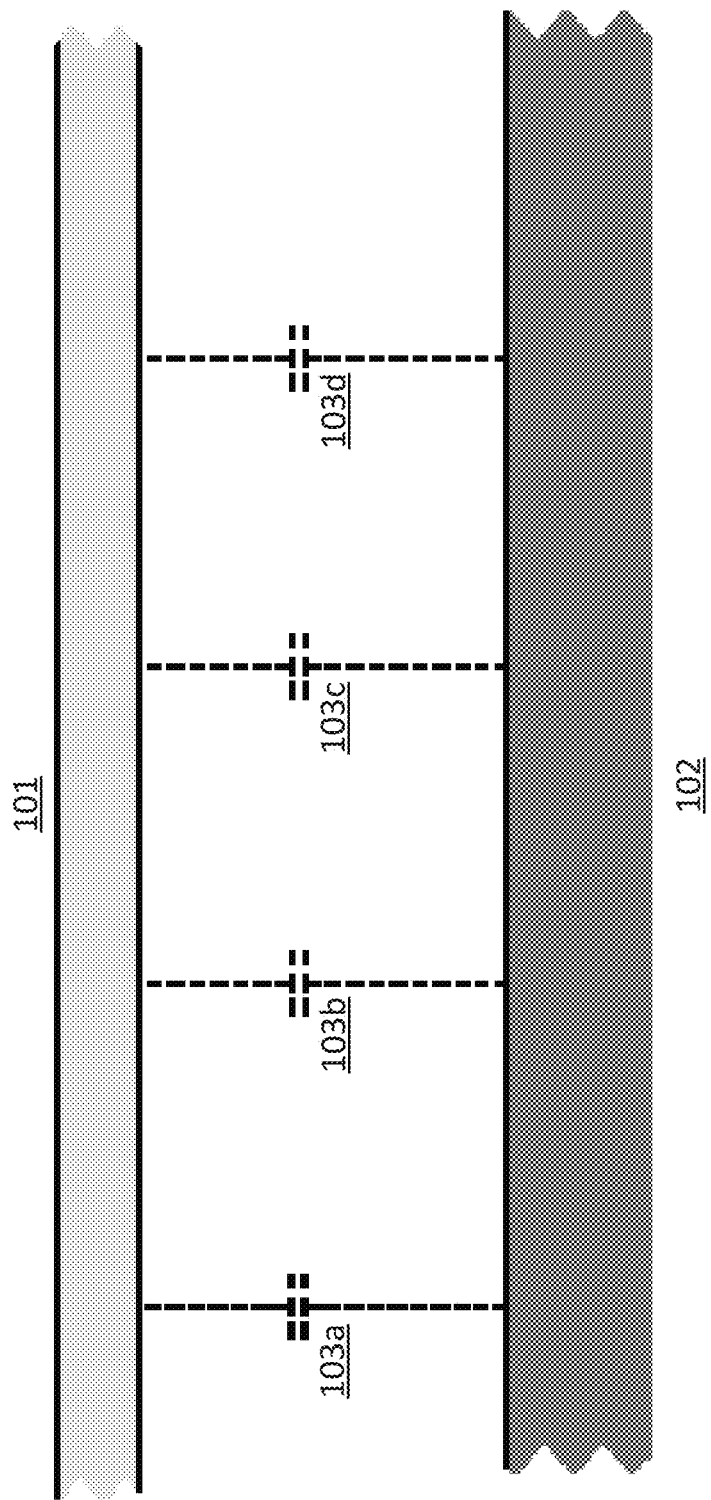

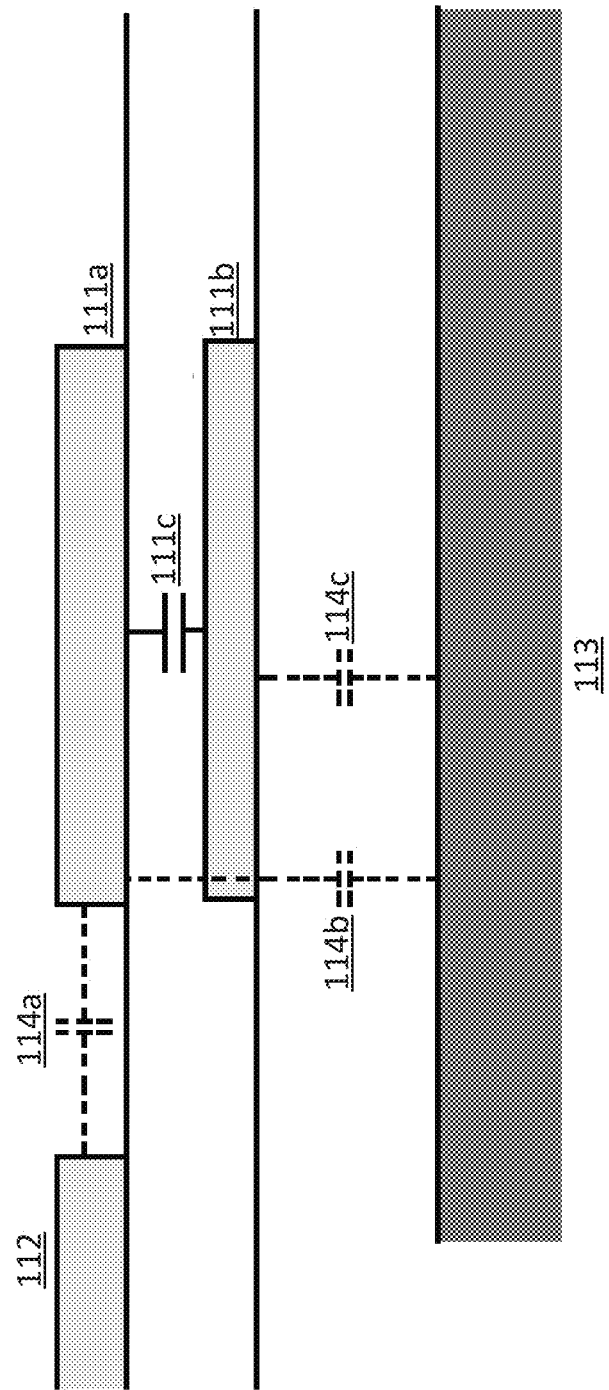

APPARATUS AND METHOD TO BALANCE THE PARASITIC CAPACITANCES BETWEEN METAL TRACKS ON AN INTEGRATED CIRCUIT CHIP

FIELD OF THE DISCLOSURE

The present disclosure relates to an apparatus and method for balancing the parasitic capacitances between two or more metal tracks in an integrated circuit chip.

BACKGROUND

Parasitic capacitance refers to the undesired capacitance developed between nearby parts of an electrical component. Unfortunately, parasitic capacitance cannot be directly measured or modeled since any attempt to directly measure the parasitic capacitance of the electrical component with an instrument will indirectly induce some parasitic capacitance between the instrument and the electrical component. As such, what is measured instead is the performance affected by the parasitic capacitance. Imbalanced parasitic capacitance, for example, affects the AC common-mode rejection ratio (CMRR) performance of an amplifier. The CMRR is a ratio of the common-mode gain to the differential mode gain of the amplifier. The CMRR indicates how much of a common-mode signal applied at a pair of inputs at the amplifier will be rejected at the output. The CMRR includes a DC specification and an AC specification. At low frequencies, the AC CMRR is initially dependent on the DC performance. However, as the frequency increases, the AC CMRR performance begins to degrade. Further, for inputs with more imbalanced parasitic capacitance, the AC CMRR performance degrades faster than for those inputs with more balanced parasitic capacitance.

The effect of the imbalanced parasitic capacitance on the AC CMRR performance can be determined by comparing the output of the AC CMRR performance for a specific component to a preferred output. However, the effect of the imbalanced parasitic capacitance can only be measured after the integrated circuit, including the amplifier, is fabricated. As such, if the AC CMRR performance is not good enough, changes will likely need to be made to the layout of the amplifier circuit and the integrated circuit will need to be fabricated again. Such changes to the layout and integrated circuit result in an increase of time and money.

There is thus a need to efficiently balance the parasitic capacitances between the two inputs of the amplifier in order to improve the AC CMRR performance.

SUMMARY OF THE DISCLOSURE

In certain embodiments, an apparatus for balancing parasitic capacitances present at a plurality of input structures of an integrated circuit includes: at least one first structural element associated with a first one of the input structures; and at least one second structural element associated with a second one of the input structures, wherein (i) the at least one first structural element and the at least second structural element are detachable from an associated input structure and (ii) the balancing of the parasitic capacitances depends on a selective detachment of at least one of the at least one first and second structural elements.

In certain embodiments, a method for balancing parasitic capacitances present at a plurality of input structures of an integrated circuit, in which at least one first structural element is attached to a first input structure and at least one second structural element is attached to a second input structure includes: selectively detaching at least one of the at least one first and second structural elements from associated input structures in order to produce a pattern of at least one detached structural element that achieves the balancing of the parasitic capacitances.

In certain embodiments, an apparatus for balancing parasitic capacitances present at a plurality of input structures of an integrated circuit includes: at least one means for detaching from at least one associated input structure in order to produce a pattern of at least one detached means that achieves the balancing of the parasitic capacitances.

BRIEF DESCRIPTION OF THE DRAWINGS

FIG. 1A illustrates an example of the parasitic capacitance between a metal track and a substrate.

FIG. 1B illustrates an example of the parasitic capacitance of a parallel plate capacitor.

DETAILED DISCLOSURE

Figure 1C:
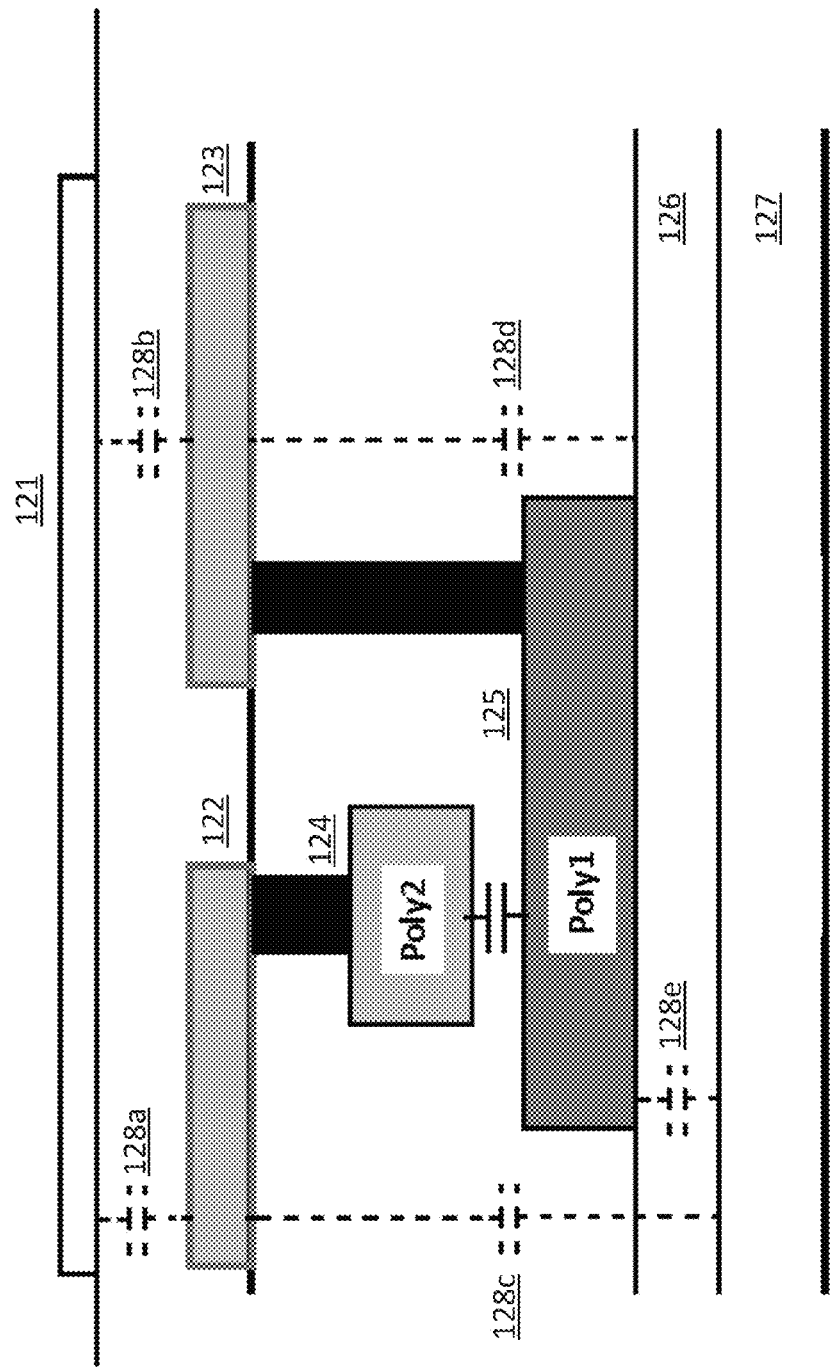
FIG. 1C illustrates an example of the parasitic capacitance of a poly-poly capacitor.

The following description of embodiments provides non-limiting representative examples referencing numerals to particularly describe features and teachings of different aspects of the disclosure. The embodiments described should be recognized as capable of implementation separately, or in combination, with other embodiments from the description of the embodiments. A person of ordinary skill in the art reviewing the description of embodiments should be able to learn and understand the different described aspects of the disclosure. The description of embodiments should facilitate understanding of the disclosure to such an extent that other implementations, not specifically covered but within the knowledge of a person of skill in the art having read the description of embodiments, would be understood to be consistent with an application of the disclosure.

Embodiments of the present disclosure provide apparatuses and methods for balancing parasitic capacitances between metal tracks in an integrated circuit chip. Specifically, additional capacitances in the form of, for example, tab capacitors, are attached to the metal tracks with the intention of detaching a select number of the attached capacitances for the purpose of balancing the parasitic capacitances between the metal tracks. The attached capacitances may be structural metal elements. Further, the attached structural metal elements may be detachable at thin-film resistive material associated with each of the attached structural metal elements.

FIG. 1A illustrates an example of the parasitic capacitance between a metal track 101 and a substrate 102. As depicted in FIG. 1A, the interaction of metal track 101 and substrate 102 results in parasitic capacitances 103a-103d. Further, as depicted in FIG. 1A, the parasitic capacitance 103a-103d may be vertical in nature. In other words, only the structures above and below the parasitic capacitances 103a-103d are affected.

FIG. 1B illustrates an example of the parasitic capacitance of a parallel plate capacitor. As depicted in FIG. 1B, the parallel plate capacitor includes a top metal plate 111a and bottom metal plate 111b. Further, the parallel plate capacitor includes a desired capacitance 111c. However, as depicted in the figure, the interaction between the top metal plate 111a and a substrate 113 also results in parasitic capacitance 114b. Further, the interaction between the bottom metal plate 111b and the substrate 113 results in parasitic capacitance 114c. In addition, the interaction between top metal plate 111a and a nearby metal 112 results in a lateral parasitic capacitance 114a. As such, parasitic capacitance can be vertical (e.g., 114b and 114c) or it can be lateral, affecting structures side to side.

FIG. 1C illustrates an example of the parasitic capacitance of a "poly-poly" capacitor. As depicted in FIG. 1C, the "poly-poly" (i.e., Polysilicon-Oxide-Polysilicon) capacitor includes metal layers 122 and 123, a first polysilicon layer 125, a second polysilicon layer 124, and a field oxide layer 126. Further, as depicted in the figure, the interaction between metal track 121 and the metal layer 122 results in a parasitic capacitance 128a. Likewise, a parasitic capacitance, 128b, exists between the metal track 121 and the metal layer 123. Further, there is a parasitic capacitance, 128c, between the metal layer 122 and substrate 127; a parasitic capacitance, 128d, between the metal layer 123 and the field oxide layer 126; and a parasitic capacitance, 128e, between the first polysilicon layer 125 and the substrate 127.

Accordingly, as depicted by FIGS. 1A-1C, parasitic capacitances can exist for a variety of different structures. Further, the overall parasitic capacitance affecting any structure is the net sum of all of the parasitic capacitances affecting the structure. For example, the parasitic capacitances can be present at various input structures of an integrated circuit, such as input metal tracks, bond pads, ESD diode cells, thin or thick film resistors. A parasitic capacitance imbalance may arise from the asymmetry existing in any of the aforementioned input structures. Also, due to the many variables in an integrated circuit layout design, as well as slight differences in integrated circuit structures (e.g., size, shape and location), the parasitic capacitances between circuit structures can still remain imbalanced even if the circuit structures are associated with a symmetrical integrated circuit layout design.

As such, in order to balance the parasitic capacitance between the two or more nodes, systems and methods of the present invention are directed to providing additional capacitances to the circuit structures with the intention of later removing some of the added capacitances.

Figure 2:
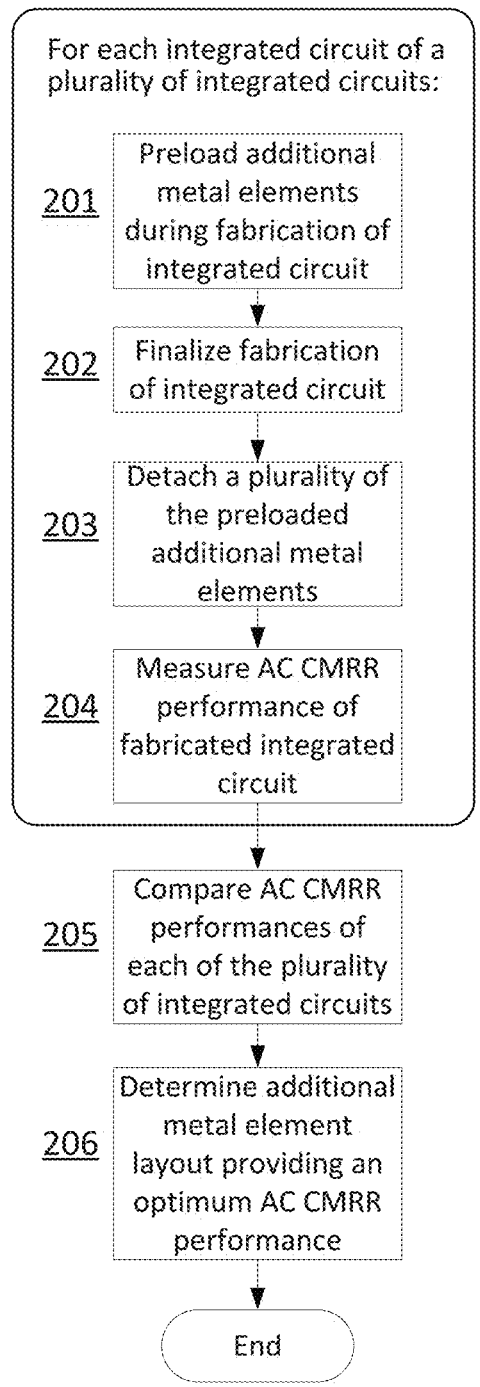
FIG. 2 illustrates an embodiment of a method of the present invention.
Figure 3A:
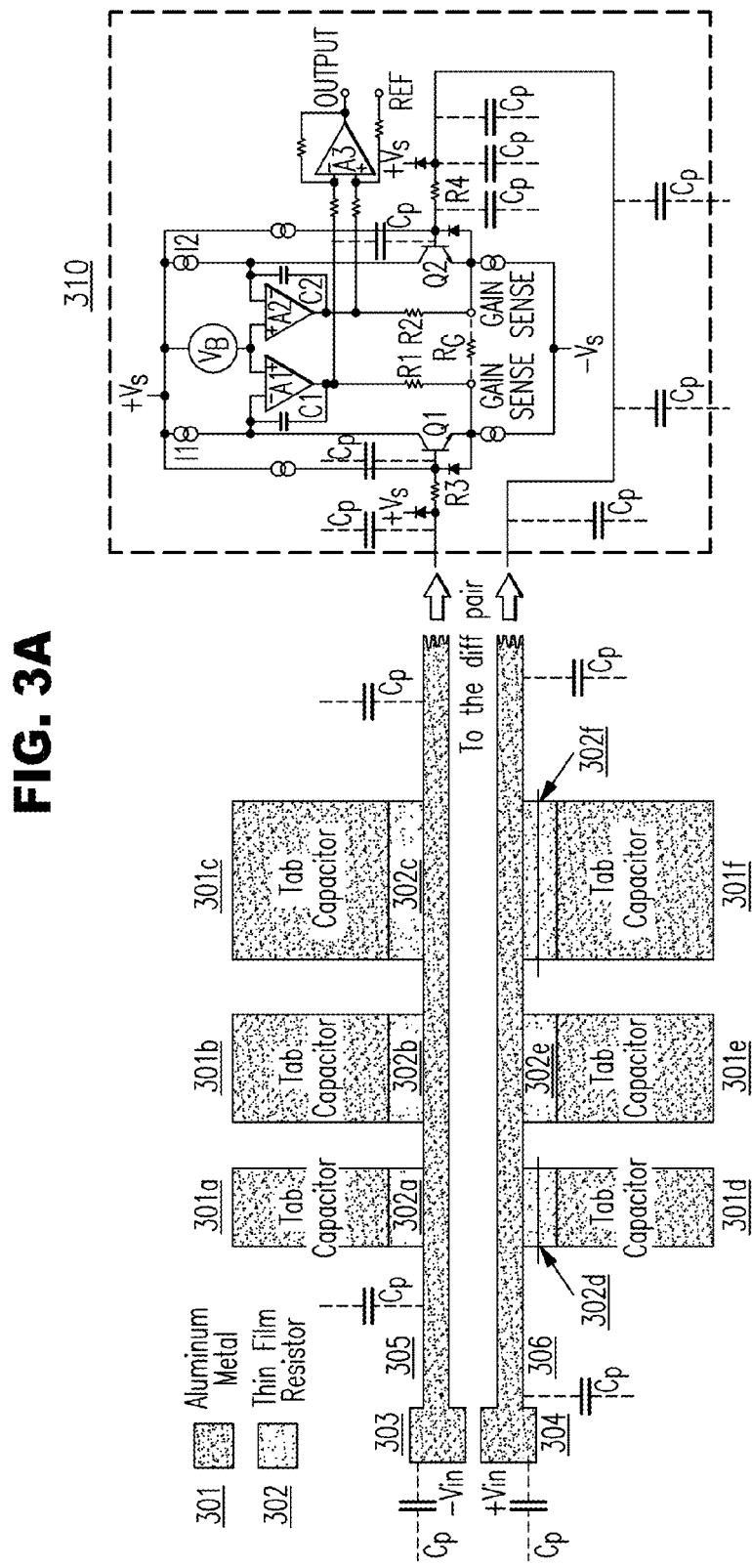
FIG. 3A illustrates an embodiment of a system layout of the present invention.

FIG. 2 illustrates an embodiment of a method of the present invention. In an embodiment, the following steps 201-204 are performed for a plurality of integrated circuits. For example, at step 201, additional structural elements (e.g., metal elements) are preloaded (e.g., attached) to the metal tracks of a potential integrated circuit of a wafer during a wafer fabrication process. In an embodiment, the additional metal elements are positioned on an angle away from the metal track. In an embodiment (for example as shown in FIG. 3A), the additional metal elements extend outwardly, away from the metal track, according to any angle, not necessarily the angle depicted in the Figures. In an embodiment, the additional metal elements are metal tabs. Further, in another embodiment, the metal tracks correspond to the input lines of an amplifier. In an embodiment, the metal tabs are sputtered on at the same instance that the metal tracks are sputtered on during the wafer fabrication process. Specifically, before the metal for the metal tabs is sputtered on, additional placeholders (i.e., windows) are created for the metal tabs. As such, when the metal is sputtered on to the placeholders for the metal tracks, metal will be simultaneously sputtered on to the placeholders for the metal tabs as well. In an embodiment, a thin-film resistive material (or thin-film resistor) grows between the metal tab and the metal track and serves as the material by which the metal tab is linked physically (i.e., joined) to its associated track. In another embodiment, the metal tabs can be preloaded to the integrated circuit in a method not including sputtering. In an embodiment, each of the metal tabs includes a capacitance. As such, preloading the integrated circuit with the additional metal tabs will result in an increase of the capacitance for the metal tracks. After the additional metal elements are preloaded to the metal tracks of the integrated circuit, in step 202, the wafer fabrication process is finalized and, thus, the die is ready to be sliced, sorted and packaged into separate integrated circuits. In an embodiment, at the end of the wafer fabrication process, both of the metal tracks and additional metal tabs may be passivated. In step 203, one or more of the plurality of the preloaded additional metal elements is detached (i.e., cut electrically) from the fabricated integrated circuit. In an embodiment, detaching the preloaded additional metal elements results in decreasing the parasitic capacitance of the corresponding metal track. As such, the parasitic capacitance of the metal tracks can be adjusted into balance by detaching one or more specific preloaded additional metal elements from the metal tracks. In an embodiment, the specific preloaded additional metal elements are detached according to a predetermined algorithm. In an embodiment, the predetermined algorithm is unique for each integrated circuit of the plurality of integrated circuits. In an embodiment, the preloaded additional metal elements are detached from the metal track by one of laser trimming or fuse opening. In an embodiment, if laser trimming is utilized to detach the additional metal element, laser trimming is performed at the thin-film resistor between the additional metal element and the metal track instead of at the additional metal element since the laser can more readily penetrate the thin-film resistor. Similarly, if fuse opening is utilized to detach the additional metal element, it is performed at the thin-film resistor between the additional metal element and the metal track. In an embodiment, after the thin-film resistors of a select number of metal elements are laser-trimmed and/or fused open, the AC CMRR performance of the fabricated integrated circuit is measured in step 204. As stated above, the effect of the parasitic capacitance on the AC CMRR performance of the integrated circuit to which the metal tracks lead can be determined by comparing the measured AC CMRR of the integrated circuit to a preferred output. Accordingly, if the parasitic capacitance imbalance between the two metal tracks is large, the output curve of the AC CMRR performance will degrade faster than if the parasitic capacitance was more balanced. For example, if the integrated circuit to which the metal tracks are connected is an instrumentation amplifier, a common mode input voltage is input to the pair of input pins associated with the metal tracks (e.g., $+V_{in}$ and $-V_{in}$) and an output voltage and error is measured at the output. As the output voltage degrades, the error value increases. Therefore, if the output curve is degrading faster than the output curve for the ideal AC CMRR of the instrumentation amplifier that output curve is indicative of greater parasitic capacitance imbalance between the metal tracks associated with the input pins of the instrumentation amplifier. Likewise, if the output curve is degrading at a rate similar to that of the ideal output curve that output curve is indicative of greater balance between the metal tracks associated with the input pins of the instrumentation amplifier. As such, in step 204, after the desired additional metal elements are detached from the corresponding metal tracks, the output curve corresponding to the AC CMRR performance of the fabricated integrated circuit is measured and compared to an ideal output curve of the fabricated integrated circuit. Therefore, the parasitic capacitance imbalance between the metal tracks of the fabricated integrated circuit can be determined. In an embodiment, as a result of applying steps 201 to 204 for each of the plurality of integrated circuits, each integrated circuit will exhibit a different pattern (e.g., placement) of detached additional metal elements. In other words, each integrated circuit includes a unique combination of desired additional metal elements detached from the metal tracks. Accordingly, for each of the plurality of integrated circuits, step 203 will likely be different. Further, in an embodiment, steps 201 and 202 for each integrated circuit can occur simultaneously. In other words, the additional metal elements may be preloaded simultaneously (e.g., through sputtering or another method) for each integrated circuit being manufactured. Similarly, the integrated circuits can also be fabricated and finalized simultaneously. In an embodiment, the detachment of the desired additional metal elements from each of the fabricated integrated circuits in step 203 can also occur simultaneously. In another embodiment, the detachment of the desired additional metal elements from each of the fabricated integrated circuits can occur sequentially. In another embodiment, the detachment of the desired additional metal elements from each of the fabricated integrated circuits can occur sequentially for some of the fabricated integrated circuits and simultaneously for other integrated circuits. Likewise, measuring the AC CMRR performance for each of the fabricated integrated circuits in step 204 can occur (i) simultaneously, (ii) sequentially or (iii) sequentially for some of the fabricated integrated circuits and simultaneously for other integrated circuits. Accordingly, once the output curve (i.e., corresponding to the AC CMRR performance) for each of the fabricated integrated circuits is determined, the output curves can be utilized to determine which additional metal element layout (i.e., the layout of additional metal elements for the integrated circuit) provides the optimum AC CMRR performance (i.e., resulting in an output curve that is as close as possible to the ideal output curve). For example, as depicted by step 205, the AC CMRR performances for each of the plurality of integrated circuits are compared. As such, in an embodiment, based on the comparison of the AC CMRR performances, one of the additional metal element layouts may be determined as providing optimum AC CMRR performance (e.g., as depicted by step 206). In other words, after detaching a different pattern of additional metal elements (e.g., tabs) from each integrated circuit in step 203 to produce a respective additional metal element layout, the layout producing the optimum performance for AC CMRR is selected in step 206. In another embodiment, the additional metal element layout providing optimum AC CMRR performance can be determined based on a plurality of integrated circuits indicating such. For example, the additional metal element layouts for a plurality of integrated circuits might each provide a good or very good AC CMRR performance but the combination (e.g., including some additional metal element placements from certain additional metal element layouts) may provide the best AC CMRR performance. In another embodiment, the fabricated integrated circuits can be assembled (e.g., during step 202) with an opening at the top and, thus, the preloaded additional metal elements of the fabricated integrated circuit may be detached (e.g., step 203) and measured (e.g., step 204) until an optimum additional metal element layout is determined. Therefore, in an embodiment, with the additional metal element layout determined at step 206, a specific detachment algorithm can be written to laser-trim (or fuse open) the additional metal elements of each and every potential integrated circuit device the same way, that is, according to the optimum additional metal element layout determined in 206. In another embodiment, instead of a specific detachment algorithm, a specific attachment algorithm (e.g., a designated mask data set) can be generated in order to preload the optimum additional metal element layout to each and every potential integrated circuit device the same way. As such, each and every potential integrated circuit will contain the same parasitic capacitance balance between the specified metal tracks of the integrated circuit. In an embodiment, because other precision trims are most likely necessary for the fabricated integrated circuit (e.g., Vosi, Voso, Gain Accuracy, and DC CMRR), the specific detachment algorithm is run and applied to the fabricated integrated circuit around the same time (i.e., simultaneously and/or sequentially) as the other precisions trims. In an embodiment, the specific detachment algorithm should remain for the life of the product unless there is a layout change that impacts parasitic capacitance of the metal tracks. Further, because the precision trims occur at a separate step than the AC CMRR performance measurements, the precision trim step (i.e., including detachment of the additional metal elements) is performed much faster than provided with the current solutions. In another embodiment, instead of metals tabs, at least one of "dummy" (i) ESD cells, (ii) diodes, (iii) bond pads, or (iv) transistor structures may be preloaded and selectively detached in order to balance the parasitic capacitance between the metal tracks. In an embodiment, although the above method was discussed in the context of an amplifier in an integrated circuit, the method of the present invention can be applied to any apparatus or structure requiring parasitic capacitance balancing between any two or more internal metal tracks of the apparatus or structure.

In an embodiment, all of the aforementioned steps can be performed by manufacturing equipment associated with the integrated circuit fabrication process. The circuitry further executes the aforementioned specific detachment algorithm.

FIG. 3A illustrates an embodiment of a system layout of the present invention. The system layout of FIG. 3A includes a negative input bond pad 303, a positive input bond pad 304, a metal track 305 connected to the negative input bond pad 303 at a first end, and a first input of a differential pair of instrumentation amplifier 310 at a second end, a metal track 306 connected to the positive bond pad 304 at a first end and a second input of the differential amplifier 310 at a second end, tab capacitors 301a-f (serving as the additional metal elements mentioned above) and thin-film resistors 302a-f. The system layout also includes a plurality of parasitic capacitances $C_P$. As an initial matter, certain elements in FIG. 3A (and FIGS. 3B and 3C) are not depicted to scale. Specifically, certain elements appear larger relative to the other elements in order to facilitate the understanding of the present invention. In an embodiment, as depicted in the figure, each of the tab capacitors 301a-f extends outwardly, at an angle (not necessarily perpendicularly), away from the metal tracks 305 and 306. In an embodiment, tab capacitors 301a-f are comprised of aluminum metal and the thin-film resistors 302a-f are grown between the metal tracks 305 and 306 and the corresponding tab capacitors 301a-301f. In an embodiment, each of the tab capacitors 301a-f includes a capacitance. As such, the tab capacitors 301a-f increase the capacitance for each of the metal tracks 305 and 306, respectively. Therefore, in order to balance the parasitic capacitance between the metal tracks 305 and 306, at least one of the tab capacitors 301a-f may be electrically detached from the corresponding metal track. In an embodiment, at least one of the tab capacitors 301a-f can be detached by laser-trimming (or fusing open) at least one of the corresponding thin-film resistors 302a-f developed between the tab capacitor and the corresponding metal track. For example, as depicted in FIG. 3A, tab capacitors 301d and 301f are detached by laser trimming (or fusing open) the associated thin-film resistor 302d and 302f. Further, although only three tab capacitors per metal track are depicted in FIG. 3A, any number of tab capacitors can be preloaded (i.e., added) to the metal tracks. Moreover, the metal tracks 305 and 306 may be connected to differing numbers of tab capacitors. Further, although the tab capacitors 301a-f are depicted as rectangles, in another embodiment, the tab capacitors can be of a variety of shapes and sizes. Further, the tab capacitors 301a-f can be comprised of a metal other than aluminum, such as copper, gold, silver or tungsten. Further, in an embodiment, tab capacitors 301a-f and metal tracks 305 and 306 are passivated while bond pads 303 and 304 are un-passivated.

Further, in an embodiment, the instrumentation amplifier 310, as depicted in FIG. 3A, is the Analog Devices® AD620. However, in another embodiment, other instrumentation amplifiers (e.g., Analog Devices® AD8221, Analog Devices® AD8421, etc.) can also be utilized. Further, instead of an instrumentation amplifier, 310 can correspond to any apparatus or structure requiring parasitic capacitance balancing between any two or more internal metal tracks.

Figure 3B:
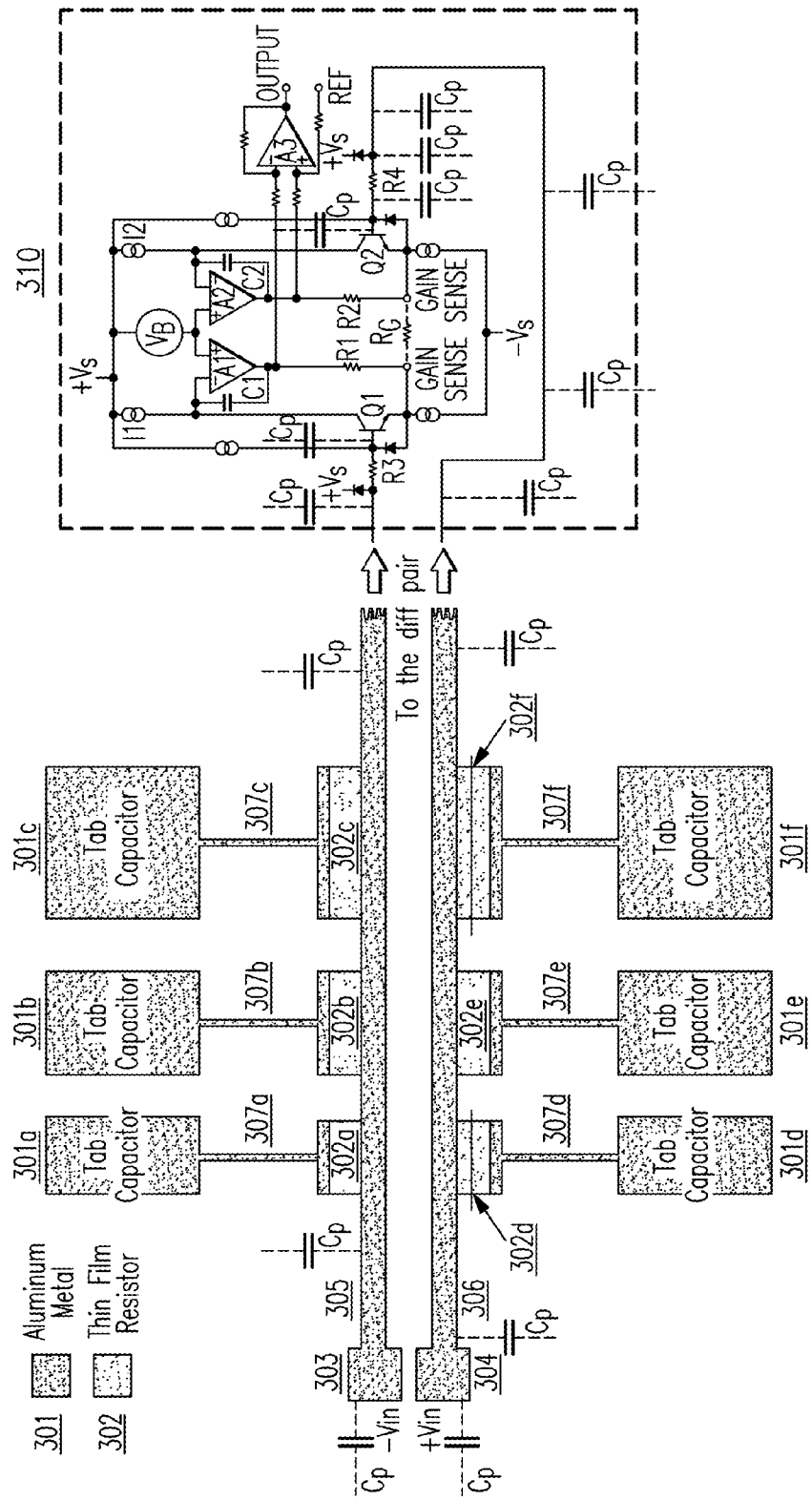
FIG. 3B illustrates another embodiment of a system layout of the present invention.

FIG. 3B illustrates another embodiment of a system layout of the present invention. The system layout includes elements similar to the elements in FIG. 3A, but also includes long, thin metal runs 307a-f. In an embodiment, the metal runs 307a-f push tab capacitors 301a-f further away from the metal tracks 305 and 306. The metal runs 307a-f need not push the tab capacitors away at a 90 degree angle. In an embodiment, pushing the tab capacitors 301a-f further away from metal tracks 305 and 306 (i) reduces the lateral parasitic capacitance between each of the tab capacitors 301a-f and (ii) increases the effectiveness of detaching the tab capacitors 301a-f during the laser-trimming (or fusing open) of the corresponding thin-film resistors 302a-f. Although depicted as of equal length to one another in FIG. 3B, the metal runs 307a-f may exhibit lengths that differ from one another.

Figure 3C:
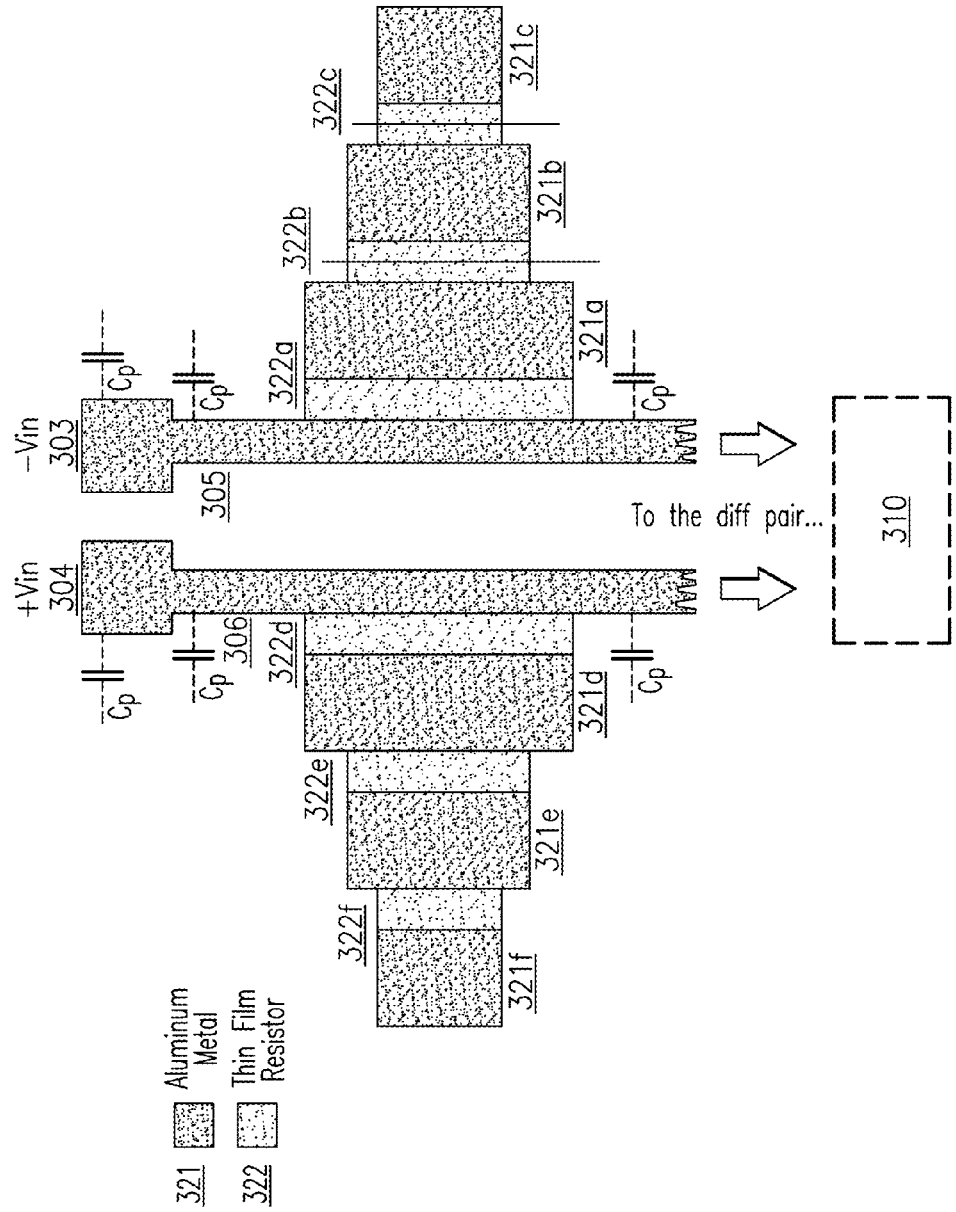
FIG. 3C illustrates an embodiment of a layout of the additional metal elements.

FIG. 3C illustrates an embodiment of a layout of the additional metal elements. The system layout of FIG. 3C includes elements similar to the elements in FIG. 3A except that some of the tab capacitors 321a-f are not adjacent to the metal tracks 305 and 306 but, instead, are only adjacent to other tab capacitors. In other words, multiple tab capacitors (i.e., 321b, 321c, 321e and 321f) extend outwardly from tab capacitors (i.e., 321a and 321d) adjacent to the metal tracks 305 and 306. As such, contrary to FIGS. 3A and 3B, some of the thin film resistors in FIG. 3C will grow between adjacent tap capacitors. Accordingly, with the stacked tab capacitor layout of FIG. 3C, multiple tab capacitors can be detached by laser trimming (or fusing open) a thin-film resistor adjacent to multiple outwardly extending tab capacitors. For example, if only thin-film resistor 322c is laser-trimmed (or fused open), than only tab capacitor 321c will be detached. On the other hand, if thin-film resistor 322b is laser-trimmed (or fused open), than both of tab capacitors 321b and 321c will be detached. Further, as stated previously, although FIG. 3C depicts the tab capacitors as rectangles, in another embodiment, the tab capacitors can be of a variety of shapes and sizes (e.g., the tab capacitors could include curved ends and/or edges). Further, in another embodiment, the tab capacitor layout can include a combination of FIG. 3A and FIG. 3B.

Figure 4A:
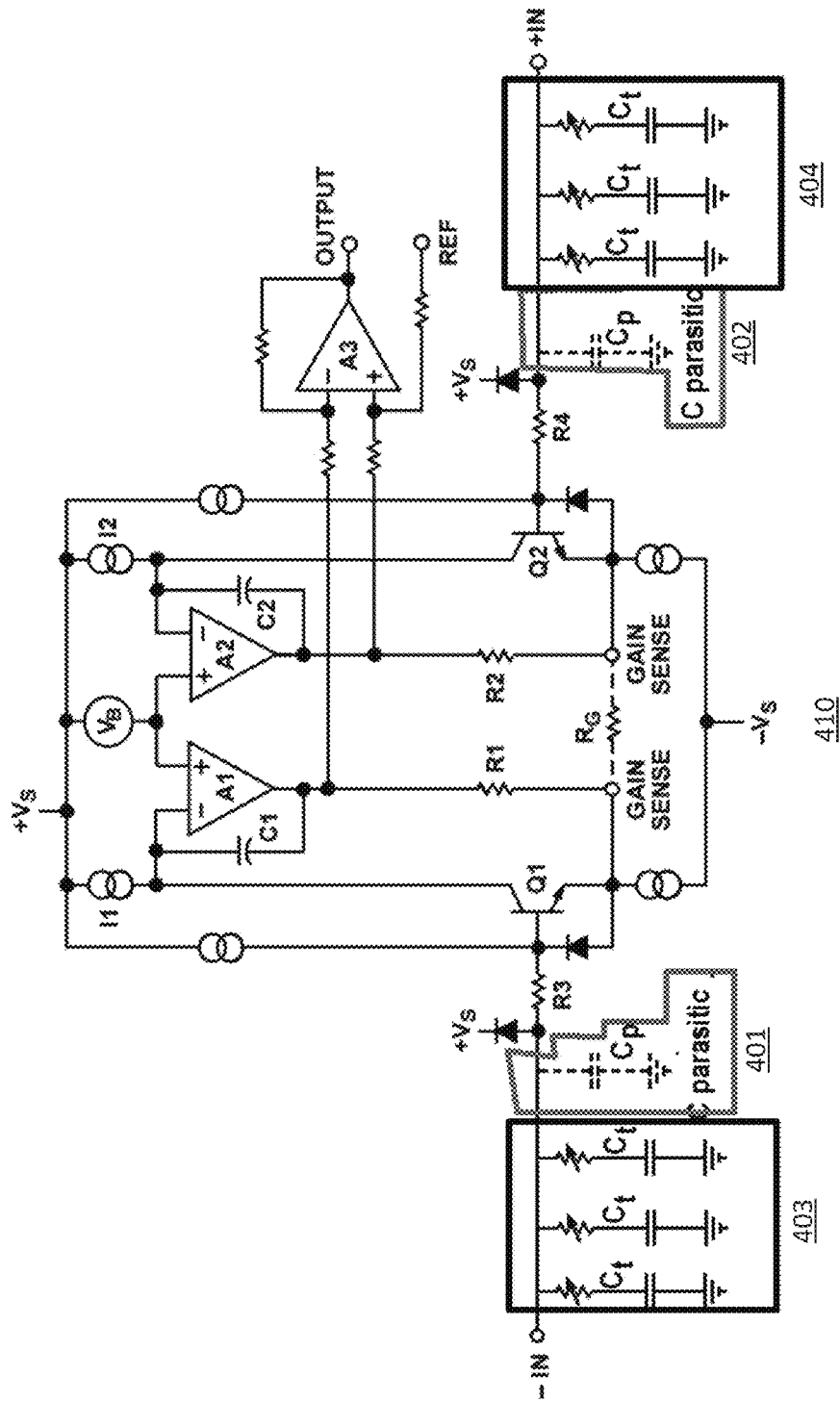
FIG. 4A illustrates an embodiment of the placement of the additional metal elements in the system layout of the present invention.

FIG. 4A illustrates an embodiment of the placement of the additional metal elements in the system layout of the present invention. The system layout of FIG. 4A includes an instrumentation amplifier 410, parasitic capacitances 401 and 402 and tab capacitors sets 403 and 404. In an embodiment, instrumentation amplifier 410 corresponds to the instrumentation amplifier 310 of FIGS. 3A-3C. Further, parasitic capacitance 401 corresponds to the parasitic capacitance of the metal track between negative input pin −IN and a first input of a differential pair of instrumentation amplifier 410. Similarly, parasitic capacitance 402 corresponds to the parasitic capacitance of the metal track between positive input pin +IN and a second input of a differential pair of instrumentation amplifier 410. In an embodiment, tab capacitor sets 403 and 404 include a plurality of tab capacitors that can be laser-trimmed (or fused open) in order to balance the parasitic capacitances between the metal track associated with the positive input pin +IN and the metal track associated with the negative input pin −IN. In an embodiment, each of the tab capacitors of the tab capacitor sets 403 and 404 can be can be laser-trimmed (or fused open) at the resistor (e.g., thin-film resistor) associated with each of the tab capacitors.

Figure 4B:
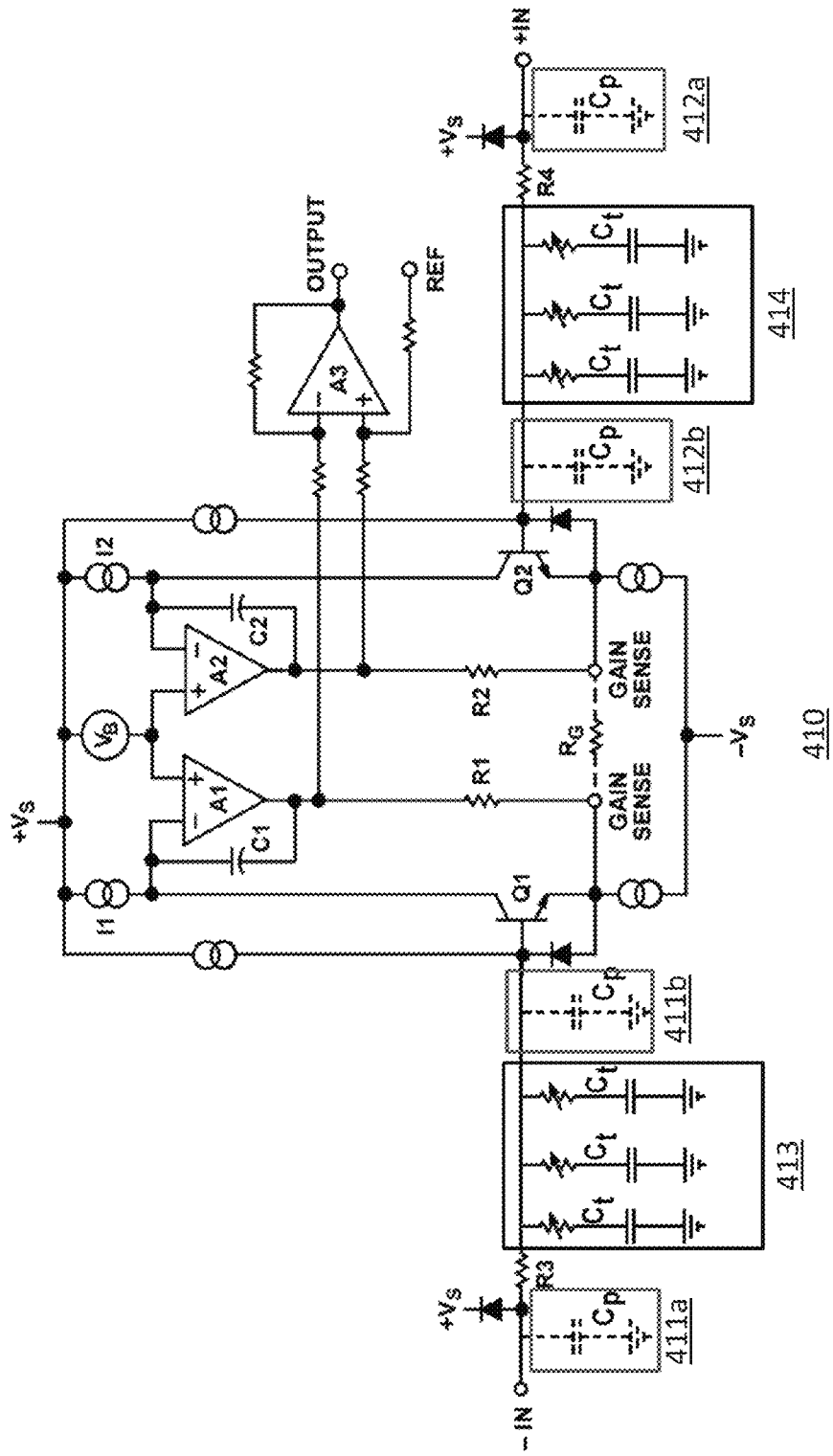
FIG. 4B illustrates another embodiment of the placement of the additional metal elements in the system layout of the present invention.

FIG. 4B illustrates another embodiment of the placement of the additional metal elements in the system layout of the present invention. The system layout of FIG. 4B includes elements similar to the system layout of FIG. 4A except that tab capacitor sets 413 and 414 are placed after the diodes (i.e., diode +$V_S$) and resistors (i.e., resistors R3 and R4) associated with the first and second inputs of the differential pair of the instrumentation amplifier 410, respectively, as opposed to before the diodes and resistors. Further, the parasitic capacitance of the metal track associated with the negative input pin −IN is represented by parasitic capacitances 411a and 411b. Likewise, the parasitic capacitance of the metal track associated with the positive input pin +IN is represented by parasitic capacitances 412a and 412b.

Several embodiments of the disclosure are specifically illustrated and/or described herein. However, it will be appreciated that modifications and variations of the disclosure are covered by the above teachings and within the purview of the appended claims without departing from the spirit and intended scope of the disclosure. Further variations are permissible that are consistent with the principles described above.

What is claimed is:
1. An integrated circuit chip having balanceable parasitic capacitances, the integrated circuit chip comprising:
    a circuit;
    a plurality of input structures to the circuit; and a plurality of structural elements fabricated on the integrated circuit chip during a wafer fabrication process, the plurality of structural elements comprising at least one first structural element associated with a first one of the input structures and at least one second structural element associated with a second one of the input structures, wherein (i) the at least one first structural element and the at least second structural element are detachable from an associated input structure and (ii) the balancing of the parasitic capacitances depends on a selective detachment of at least one of the at least one first and second structural elements.

2. The integrated circuit chip as recited in claim 1, wherein the at least one first and second structural elements extend laterally at an angle from the associated input structure.

3. The integrated circuit chip as recited in claim 2, wherein the angle is 90 degrees.

4. The integrated circuit chip as recited in claim 1, wherein:
the at least one first structural element extends laterally from the first input structure at a first angle, and
the at least one second structural element extends laterally from the second input structure at a second angle different than the first angle.

5. The integrated circuit chip as recited in claim 1, wherein the input structures include at least one of metal tracks, bond pads, ESD diode cells, thin-film resistors, and thick-film resistors.

6. The integrated circuit chip as recited in claim 1, wherein at least one of the at least one first and second structural elements is formed of a metal, wherein the metal is one of aluminum, copper, gold, silver and tungsten.

7. The integrated circuit chip as recited in claim 1, further comprising:
a metal run via which one of the at least one first and second structural elements is joined to the associated input structure.

8. The integrated circuit chip as recited in claim 1, further comprising:
a thin-film resistive material via which at least one of the at least one first and second structural elements is joined to the associated input structure.

9. The integrated circuit chip as recited in claim 8, wherein at least one of the at least one first and second structural elements is detachable from the associated input structure by one of (i) laser trimming and (ii) fuse opening at the thin-film resistive material.

10. The integrated circuit chip as recited in claim 1, further comprising a third structural element, wherein the third element is interposed between (i) one of the at least one first and second structural elements and (ii) the associated input structure.

11. The integrated circuit chip as recited in claim 1, wherein the plurality of input structures and the at least one first and second structural elements are passivated.

12. The integrated circuit chip as recited in claim 1, wherein the circuit comprises a differential pair including a first transistor electrically connected to the first input structure and a second transistor electrically connected to the second input structure.

13. The integrated circuit chip as recited in claim 1, wherein the circuit comprises an amplifier, wherein a common mode rejection ratio performance of the amplifier depends on the selective detachment.

14. A method for balancing parasitic capacitances present at a plurality of input structures of an integrated circuit, in which at least one first structural element is attached to a first input structure and at least one second structural element is attached to a second input structure, comprising:
selectively detaching at least one of the at least one first and second structural elements from associated input structures in order to produce a pattern of at least one detached structural element that achieves the balancing of the parasitic capacitances;
measuring, after the detaching, a common mode rejection ratio performance of the integrated circuit; and
determining parasitic capacitances between the first and second input structures based on the measured common mode rejection ratio performance.

15. The method of claim 14, further comprising:
comparing the determined parasitic capacitances with parasitic capacitances associated with at least one other integrated circuit; and
determining the pattern of at least one detached structural element that achieves the balancing of the parasitic capacitances based on the comparison.

16. The method of claim 15, further comprising:
fabricating at least one new integrated circuit based on the pattern.

17. The method of claim 15, further comprising comparing the measured common mode rejection ratio performance of the integrated circuit to an ideal common mode rejection ratio performance of the integrated circuit.

18. The method of claim 14, wherein the detaching step includes one of (i) laser trimming and (ii) fuse opening a thin-film resistive material associated with one of the at least one first and second structural elements.

19. A method for balancing parasitic capacitances present at a plurality of input structures of an integrated circuit, in which at least one first structural element is attached to a first input structure and at least one second structural element is attached to a second input structure, comprising:
sputtering metal onto placeholders for the at least one structural element and the at least one second structural element, wherein the metal is sputtered onto the placeholders for the plurality of structural elements at the same time as the metal is sputtered onto placeholders for the plurality of input structures; and
selectively detaching at least one of the at least one first and second structural elements from associated input structures in order to produce a pattern of at least one detached structural element that achieves the balancing of the parasitic capacitances.

20. The method of claim 19, wherein the input structures include at least one of metal tracks, bond pads, ESD diode cells, thin-film resistors, and thick-film resistors.

* * * * *